(12) United States Patent
Liu et al.

(10) Patent No.: US 11,373,821 B2
(45) Date of Patent: Jun. 28, 2022

(54) MAGNETIC PRESS KEY

(71) Applicant: DONGGUAN JINGYANG ELECTRONICS AND TECHNOLOGY CO. LTD., Guangdong (CN)

(72) Inventors: Lucy Liu, Guangdong (CN); Andong Li, Guangdong (CN)

(73) Assignee: DONGGUAN JINGY ANG ELECTRONICS AND TECHNOLOGY CO. LTD., Dongguan (CN)

( * ) Notice: Subject to any disclaimer, the term of this patent is extended or adjusted under 35 U.S.C. 154(b) by 365 days.

(21) Appl. No.: 16/734,403

(22) Filed: Jan. 5, 2020

(65) Prior Publication Data

US 2020/0144006 A1 May 7, 2020

Related U.S. Application Data

(63) Continuation of application No. PCT/CN2018/111672, filed on Oct. 24, 2018.

(30) Foreign Application Priority Data

Nov. 16, 2017 (CN) .......................... 201711138848.0

(51) Int. Cl.
*H01H 36/00* (2006.01)
*H01H 13/85* (2006.01)

(52) U.S. Cl.
CPC ............ *H01H 13/85* (2013.01); *H01H 36/00* (2013.01); *H01H 2215/00* (2013.01); *H01H 2231/002* (2013.01); *H01H 2235/01* (2013.01)

(58) Field of Classification Search
CPC ...... H01H 13/85; H01H 36/00; H01H 36/004; H01H 36/0073; H01H 2215/042; H01H 2221/04; H03K 17/97–17/972
See application file for complete search history.

(56) References Cited

U.S. PATENT DOCUMENTS

2017/0302275 A1* 10/2017 Wang ..................... H03K 17/97

\* cited by examiner

*Primary Examiner* — Ramon M Barrera

(57) ABSTRACT

A magnetic press key includes a housing and a central shaft body disposed in the housing, wherein the bottom of the central shaft body is extended into the housing, and the central shaft body can reciprocate in the vertical direction in a base after the key cap seat is pressed, a first magnetic element is provided on the upper section of the central shaft body, a second magnetic element which can move up and down is provided under the coaxiality of the first magnetic element, and a third magnetic element is provided in the housing. The first magnetic element and the second magnetic element generate repulsive or attractive magnetic force, and the magnitude of the repulsive or attractive magnetic force can be adjusted by changing the magnitude of the energizing current of the energized coil, so that the use hand feeling of the key cap seat is improved.

8 Claims, 3 Drawing Sheets

MAGNETIC PRESS KEY

CROSS REFERENCE TO RELATED APPLICATIONS

The present application is a Continuation Application of PCT Application No. PCT/CN2018/111672 filed on Oct. 24, 2018, which claims the benefit of Chinese Patent Application No. 201711138848.0 filed on Nov. 16, 2017. All the above are hereby incorporated by reference. the contents of which are incorporated herein by reference in their entirety.

TECHNICAL FIELD

The invention relates to a magnetic press key with adjustable tactile feel, in particular to a press key with adjustable tactile feel intensity.

BACKGROUND

Keyboard is the most commonly used and the most important input equipment for computers. By tapping the keyboard, English letters, numbers, punctuation marks, etc. can be input into the computer, thereby giving a command, inputting data, and the like to the computer. The keyboard is divided into mechanical keyboard, membrane keyboard, conductive silica gel keyboard and capacitive keyboard. Among them, the mechanical keyboard has a strong sense of rhythm, and the hand feeling will not change after long-term use, thereby being very popular among game players.

At present, the tactile feel and the pressure of the mechanical keyboard mainly depend on adopting different shafts and elastic sheet structures to change the tactile feel, such as four shafts of black, red, green and tea commonly used in the market. The black shaft has the strongest tactile feel; the red shaft has substantially no tactile feel; the tactile feel of the green shaft is relatively small, but is obvious in hierarchical feeling and has obvious rhythm sound; and the tactile feel of tea shaft is similar to that of the green shaft, but the hierarchical feeling is not strong. If the user wants to feel different hand feeling, he/she must purchase mechanical keyboards with different color shafts. If the user does not know his/her own preferences, it is easy to purchase a mechanical keyboard which is not suitable for the user, so that the user repeatedly purchase, and the cost is wasted. Likewise, it is also impossible to define the tactile feel and force of the mechanical shaft according to his/her own preference.

SUMMARY

The object of the invention is to solve the above defects and provides a magnetic press key, which changes the impact force of the magnet by controlling the coil current so as to change the tactile feel intensity of the mechanical shaft.

The object of the invention is realized by the following method:

a magnetic press key comprises a housing and a central shaft body disposed in the housing, wherein the top of the central shaft body is provided with a key cap seat, the bottom of the central shaft body is extended into the housing, and the central shaft body can reciprocate in the vertical direction in a base after the key cap seat is pressed, the central shaft body is provided with a baffle which divides the central shaft body into two sections, a first magnetic element is provided on the upper section of the central shaft body, a second magnetic element which can move up and down is provided under the coaxiality of the first magnetic element, a return spring is provided on the lower section of the central shaft body, and a third magnetic element is provided in the housing, wherein the third magnetic element is an energized coil which can adjust the magnitude of the energized current.

In the above description, it is more preferable that when the energized coil is not energized or is reversely energized, a magnetic force is generated between the first magnetic element and the second magnetic element, or a repulsive force is generated between the second magnetic element and the third magnetic element, so that the second magnetic element is kept at the upper section of the central shaft body; after the energized coil is positively energized, a magnetic force is generated between the second magnetic element and the third magnetic element and is larger than that generated between the first magnetic element and the second magnetic element, so that the second magnetic element moves towards the bottom along the central shaft body and impacts a baffle provided on the central shaft body, thereby generating a downforce tactile feel; and the magnitude of the magnetic force between the second magnetic element and the third magnetic element can be adjusted by adjusting the positive and reverse energizing current of the coil, thereby changing the tactile feel intensity and the downforce degree.

In the above description, it is more preferable that the housing is provided with two elastic sheets, and the bottom of the housing is provided with weld legs corresponding to the elastic sheets in number and position.

In the above description, it is more preferable that the first magnetic element is a soft magnetic sheet, the second magnetic element is a magnet, and the third magnetic element is an energized coil.

In the above description, it is more preferable that the first magnetic element is an electromagnet, the second magnetic element is a magnet, and the third magnetic element is an energized coil.

In the above description, it is more preferable that the first magnetic element is a soft magnetic sheet, the second magnetic element is a magnet, and the third magnetic element is an electromagnet.

In the above description, it is more preferable that the first magnetic element is an electromagnet, the second magnetic element is a magnet, and the third magnetic element is an electromagnet.

In the above description, it is more preferable that the first magnetic element is a coil, the second magnetic element is a magnet, and the third magnetic element is an electromagnet.

In a preferred derivative embodiment of the present invention, the third magnetic material is moved to the bottom of the housing, and a magnetic sensor is added at the bottom of this product to realize a magnetic press key with tactile feel. Although the intensity of tactile feel cannot be changed, this kind of structure is simple, waterproof, dustproof and has an ultra-long service life.

The beneficial effects of the present invention are as follows: the first magnetic element and the second magnetic element generate repulsive or attractive magnetic force, an energized coil forming element is designed, and the magnitude of the repulsive or attractive magnetic force can be adjusted by changing the magnitude of the energizing current of the energized coil, so that the use hand feeling of the key cap seat is improved; the magnitude of the magnetic force between the second magnetic element and the third magnetic element can be adjusted by adjusting the magnitude of the positive and reverse energizing current of the coil, so that the tactile feel intensity and the downforce degree are changed; adjusting the magnetic force of the first magnetic element and the second magnetic element can provide a more hierarchical feeling after a stronger tactile feel.

DETAILED DESCRIPTION OF THE INVENTION

The invention will be further described in detail below in combination with the drawings and the specific embodiments.
In this embodiment, reference is made to FIGS. 1 to 3.

Embodiment 1

Figure 1:
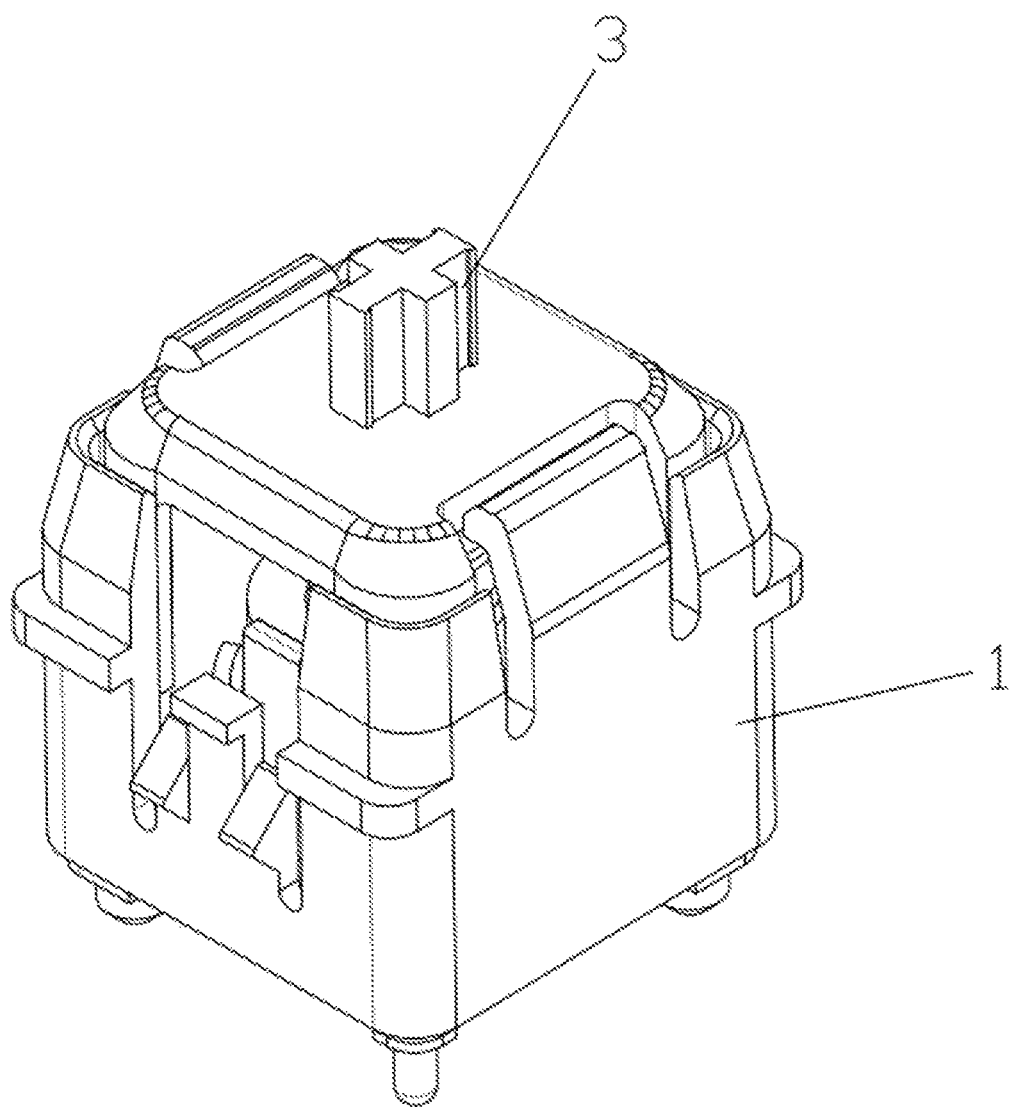
FIG. 1 is a three-dimensional structural view of Embodiment 1 of the present invention.
Figure 2:
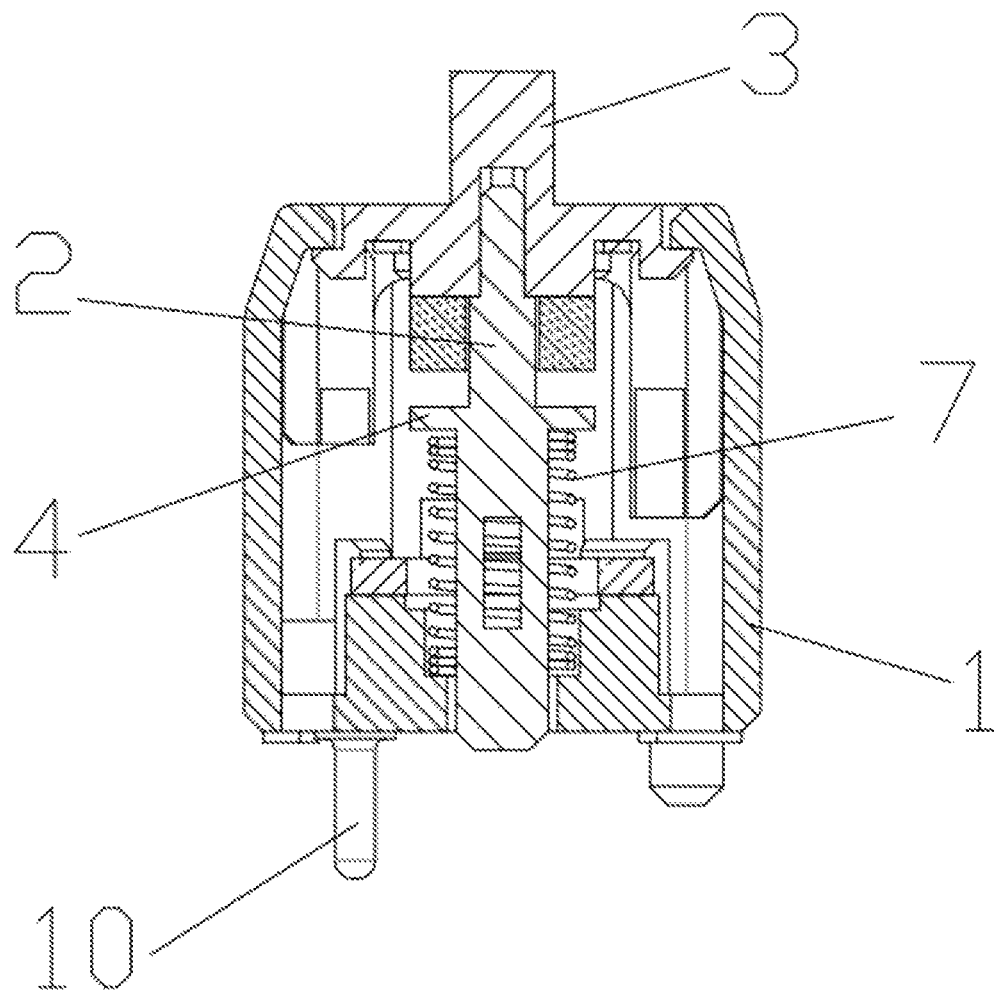
FIG. 2 is a cross-sectional view of Embodiment 1 of the present invention.
Figure 3:
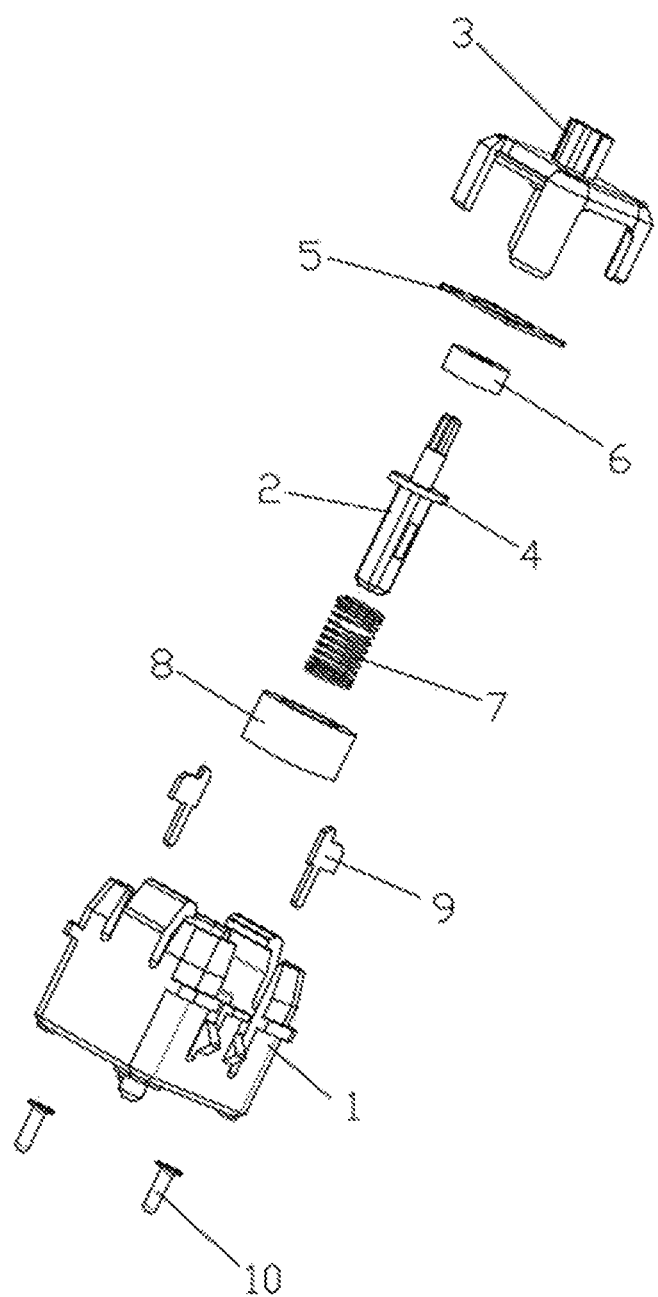
FIG. 3 is a packaging diagram of Embodiment 1 of the present invention;
in the drawings, 1-housing, 2-center shaft body, 3-key cap seat, 4-baffle, 5-first magnetic element, 6-second magnetic element, 7-return spring, 8-third magnetic element, 9-elastic sheet, and 10-weld leg.

Referring to FIGS. 1 to 3, as shown in the figures, the present embodiment includes a housing 1 and a central shaft body 2 disposed in the housing 1, wherein the top of the central shaft body 2 is provided with a key cap seat 3, the bottom of the central shaft body 2 is extended into the housing 1, and the central shaft body 2 can reciprocate in the vertical direction in a base after the key cap seat 3 is pressed. The central shaft body 2 is provided with a baffle 4 which divides the central shaft body 2 into two sections. A first magnetic element 5 is provided on the upper section of the central shaft body 2, a second magnetic element 6 which can move up and down is provided under the coaxiality of the first magnetic element 5, a return spring 7 is provided on the lower section of the central shaft body 2, and a third magnetic element 8 is provided in the housing 1, wherein the third magnetic element 8 is an energized coil which can adjust the magnitude of the energized current.

When the energized coil is not energized or is reversely energized, a magnetic force is generated between the first magnetic element and the second magnetic element, or a repulsive force is generated between the second magnetic element 6 and the third magnetic element 8, so that the second magnetic element 6 is kept at the upper section of the central shaft body 2; after the energized coil is positively energized, a magnetic force is generated between the second magnetic element and the third magnetic element and is larger than that generated between the first magnetic element 5 and the second magnetic element 6, so that the second magnetic element 6 moves towards the bottom along the central shaft body 2 and impacts a baffle provided on the central shaft body 2, thereby generating a downforce tactile feel; and the magnitude of the magnetic force between the second magnetic element and the third magnetic element can be adjusted by adjusting the positive and reverse energizing current of the coil, thereby changing the tactile feel intensity and the downforce degree.

The housing 1 of the embodiment is provided with two elastic sheets 9, and the bottom of the housing 1 is provided with weld legs 10 corresponding to the elastic sheets 9 in number and position.

The first magnetic element is a soft magnet sheet, the second magnetic element is a magnet, and the third magnetic element is a coil.

Embodiment 2

The magnetic press key of the present embodiment is different from Embodiment 1 in that the first magnetic element is an electromagnet, the second magnetic element is a magnet and the third magnetic element is a coil.

Embodiment 3

The magnetic press key of the present embodiment is different from Embodiment 1 in that the first magnetic element is a soft magnetic sheet, the second magnetic element is a magnet and the third magnetic element is an electromagnet.

Embodiment 4

The magnetic press key of the present embodiment is different from Embodiment 1 in that the first magnetic element is an electromagnet, the second magnetic element is a magnet, and the third magnetic element is an electromagnet.

Embodiment 5

The magnetic press key of the present embodiment is different from Embodiment 1 in that the first magnetic element is a coil, the second magnetic element is a magnet, and the third magnetic element is an electromagnet.

The above content is a further detailed description of the invention in combination with specific preferred embodiments, and it cannot be determined that the specific implementation of the invention is only limited to these descriptions. For those skilled in the art, without departing from the concept of the invention, several simple deduction or replacement can be made, which shall be regarded as the protection scope of the invention.

What is claimed is:
1. A magnetic press key, including a housing and a central shaft body disposed in the housing, wherein the top of the central shaft body is provided with a key cap seat, the bottom of the central shaft body is extended into the housing, and the central shaft body can reciprocate in the vertical direction in a base after the key cap seat is pressed, is characterized in that the central shaft body is provided with a baffle which divides the central shaft body into two sections, a first magnetic element is provided on the upper section of the central shaft body, a second magnetic element which can move up and down is provided under the coaxiality of the first magnetic element, a return spring is provided on the lower section of the central shaft body, and a third magnetic element is provided in the housing, wherein the third magnetic element is an energized coil, the magnitude of the energized current of energized coil being adjustable.
2. The magnetic press key according to claim 1, characterized in that when the energized coil is not energized or is reversely energized, a magnetic force is generated between the first magnetic element and the second magnetic element, or a repulsive force is generated between the second magnetic element and the third magnetic element, so that the second magnetic element is kept at the upper section of the central shaft body; after the energized coil is positively energized, a magnetic force is generated between the second magnetic element and the third magnetic element and is larger than that generated between the first magnetic element and the second magnetic element, so that the second magnetic element moves towards the bottom along the central shaft body and impacts a baffle provided on the central shaft body, thereby generating a downforce tactile feel; and the magnitude of the magnetic force between the second magnetic element and the third magnetic element can be adjusted by adjusting the positive and reverse energizing current of the coil, thereby changing the tactile feel intensity and the downforce degree.

3. The magnetic press key according to claim 1, characterized in that the housing is provided with two elastic sheets, and the bottom of the housing is provided with weld legs corresponding to the elastic sheets in number and position.

4. The magnetic press key according to claim 1, characterized in that the first magnetic element is a soft magnetic sheet, the second magnetic element is a magnet, and the third magnetic element is an energized coil.

5. The magnetic press key according to claim 1, characterized in that the first magnetic element is an electromagnet, the second magnetic element is a magnet, and the third magnetic element is an energized coil.

6. The magnetic press key according to claim 1, characterized in that the first magnetic element is a soft magnetic sheet, the second magnetic element is a magnet, and the third magnetic element is an electromagnet.

7. The magnetic press key according to claim 1, characterized in that the first magnetic element is an electromagnet, the second magnetic element is a magnet and the third magnetic element is an electromagnet.

8. The magnetic press key according to claim 1, characterized in that the first magnetic element is a coil, the second magnetic element is a magnet and the third magnetic element is an electromagnet.

\* \* \* \* \*